(12) United States Patent
Lin et al.

(10) Patent No.: US 8,525,035 B2
(45) Date of Patent: Sep. 3, 2013

(54) DOUBLE-SIDE-CONDUCTING FLEXIBLE-CIRCUIT FLAT CABLE WITH CLUSTER SECTION

(75) Inventors: Gwun-Jin Lin, Taoyuan County (TW); Chih-Heng Chuo, Taoyuan County (TW); Kuo-Fu Su, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 285 days.

(21) Appl. No.: 12/905,245

(22) Filed: Oct. 15, 2010

(65) Prior Publication Data

US 2011/0094775 A1    Apr. 28, 2011

(30) Foreign Application Priority Data

Oct. 23, 2009   (TW) ................................. 98135981 A

(51) Int. Cl.
*H05K 1/00* (2006.01)

(52) U.S. Cl.
USPC ........................................ 174/254; 174/117 F

(58) Field of Classification Search
None
See application file for complete search history.

(56) References Cited

U.S. PATENT DOCUMENTS

| | | | | |
|---|---|---|---|---|
| 4,832,621 A | * | 5/1989 | Asai et al. ..................... | 439/492 |
| 5,844,783 A | * | 12/1998 | Kojima .......................... | 361/777 |
| 6,447,314 B1 | * | 9/2002 | Kato et al. ..................... | 439/165 |
| 7,180,001 B1 | * | 2/2007 | Lin et al. ...................... | 174/117 F |
| 7,734,083 B2 | * | 6/2010 | Teramoto et al. ............. | 382/147 |
| 2007/0054519 A1 | | 3/2007 | Lin et al. | |

FOREIGN PATENT DOCUMENTS

| TW | I224129 B | 11/2004 |
|---|---|---|
| TW | I289372 B | 11/2007 |
| TW | I306199 B | 2/2009 |

* cited by examiner

*Primary Examiner* — Ishwarbhai Patel

(74) *Attorney, Agent, or Firm* — Rosenberg, Klein & Lee

(57) ABSTRACT

Disclosed is a double-side-conducting flexible-circuit flat cable with cluster section, which includes a flexible circuit substrate, a first electrical conduction path, a second electrical conduction path, a plurality of first and second conductive contact zones. The flexible circuit substrate has a first surface and a second surface and includes, in an extension direction, a first connection section, a cluster section, and at least one second connection section. The cluster section is composed of a plurality of clustered flat cable components formed by slitting in the extension direction. The first and second electrical conduction paths are respectively formed on the first and second surfaces of the flexible circuit substrate and each extends along one of the clustered flat cable components of the cluster section. The plurality of first and second conductive contact zones are respectively arranged on the first and second surfaces of the flexible circuit substrate at the first connection section. Each of the first and second conductive contact zones extends along one of the electrical conduction paths of the cluster section toward the second connection section.

9 Claims, 13 Drawing Sheets

DOUBLE-SIDE-CONDUCTING FLEXIBLE-CIRCUIT FLAT CABLE WITH CLUSTER SECTION

FIELD OF THE INVENTION

The present invention relates to a flexible circuit board, and in particular to a double-side-conducting flexible-circuit flat cable with cluster section.

BACKGROUND OF THE INVENTION

A printed circuit board (PCB) is made by first preparing a layout drawing in which electrical conductor patterns for connecting electrical components are set, and then mechanical machining and surface treatment are applied to expose the electrical conductors on an insulation substrate to thereby form a circuit board. A major function of the printed circuit board is to realize electrical connection between the electrical components. Based on the arrangement of the electrical conductor patterns, the printed circuit boards can be classified as singe-sided boards, double-sided boards, and multilayered boards. A printed circuit board that is formed with a flexible substrate is particularly referred to as a flexible printed circuit (FPC), which features light weight, extremely small thickness, softness, flexibility, and freedom of arbitrary shaping.

The double-sided flexible printing circuits find various applications in for example notebook computers, liquid crystal displays, digital cameras, mobile phones, touch panels, and a lot of other consumer electronic products. Taking touch panels as an example, the touch panels are classified as single-layered and dual-layered types according to the wiring layout. The single-layered touch panel and the dual-layered touch panel are of almost the same structure, namely comprising a glass substrate and a touch control circuit layer and the glass substrate carrying all wiring patterns thereon. A touch panel must be connected to an external control circuit in order to retrieve an electronic signal corresponding to the coordinates of the point where the touch panel is touched. Conventional means for connection between a touch panel and a control circuit comprises anisotropic conductive rubber or a double-sided flexible printed circuit that is interposed between electrodes of the touch panel and connectors of the control circuit. Recently, to improve the reliability of conduction for the touch panel and the external control circuit, the double-sided flexible printed circuit is gradually replacing the anisotropic conductive rubber.

SUMMARY OF THE INVENTION

However, the essential structure of the conventional double-sided flexible printed circuits comprises a substrate having upper and lower surfaces to which metal wiring traces, which are usually copper traces, are bonded with adhesives. An insulation layer is attached to a surface of the metal wiring traces with adhesives to completely cover the metal wiring traces. This renders the double-sided FPC difficult to deflect. Thus, it is common to provide a bending zone on the FPC. Although the state-of-the-art double-sided FPC is provided with upper-side and lower-side conductor contacts for engagement with the glass substrate of a touch panel and the electrodes of touch control circuit layer, yet due to the conventional double-sided flexible printed circuits being hard to deflect or bend, even the conventional double-sided FPC is provided with a bending zone, damage or malfunctioning may easily result from abrasion between the body and the bending zone of the double-sided FPC and a hinge pivot structure of an electronic product, such as a mobile phone and a digital camera having a touch panel and a display screen, so that transmission of signals and operation of the hinge pivot structure are adversely affected.

Further, with the progressing development trend of being light-weighted and compact for electronic products, the conductor trace lay-out area of a double-sided FPC is getting reduced and the density of wiring pattern arranged therein is increased. This, in combination with the increasing number of electronic parts included in an electronic product, makes it impossible for the conventional double-sided FPC to avoid being undesirably compressed or abraded for being incapable of evasion of components/parts, even though a bending zone is provided. Consequently, easy and fast damage and malfunctioning of the components/parts of an electronic product may occur.

Thus, an objective of the present invention is to provide a double-side-conducting flexible-circuit flat cable with cluster section, which overcomes the drawbacks of the conventional double-sided flexible printed circuits.

The solution adopted in the present invention to overcome the problems of the prior art technology comprises a double-side-conducting flexible-circuit flat cable with cluster section, which comprises a flexible circuit substrate, a first electrical conduction path, a second electrical conduction path, a plurality of first conductive contact zones, and a plurality of second conductive contact zones. The flexible circuit substrate has a first surface and a second surface, and comprises, in an extension direction, a first connection section, at least one second connection section, and a cluster section connected between the first connection section and the second connection section. The cluster section is composed of a plurality of clustered flat cable components formed by slitting in the extension direction.

The first electrical conduction path is formed on the first surface of the flexible circuit substrate and extends along one of the clustered flat cable components of the cluster section. The second electrical conduction path is formed on the second surface of the flexible circuit substrate and extends along one of the clustered flat cable components of the cluster section.

The plurality of first conductive contact zones is arranged on the first surface of the flexible circuit substrate at the first connection section to be spaced from each other. Each of the first conductive contact zones extends along one of the electrical conduction paths of the cluster section toward the second connection section. The plurality of second conductive contact zones is arranged on the second surface of the flexible circuit substrate at the first connection section to be spaced from each other. Each of the second conductive contact zones extends along one of the electrical conduction paths of the cluster section toward the second connection section.

In a preferable embodiment, at least one through-hole structure is formed through the first surface and the second surface of the flexible circuit substrate in the first connection section, the cluster section, and/or the second connection section. The through-hole structure has an inside surface on which an electrically conductive material is formed to allow selected conductive lines of the first electrical conduction path to electrically connect to the second electrical conduction path, and further allowing the first conductive contact zones or the second conductive contact zones to be connected through the selected lines of the first electrical conduction path, the through-hole structure, or the second electrical conduction path, to the second connection section to realize wiring jumping.

With the technique adopted in the present invention, since the double-sided flexible-circuit flat cable comprises first conductive contact zones and second conductive contact zones, which are respectively arranged on upper and lower surfaces of the flexible circuit substrate, and a plurality of clustered flat cable components, which is formed by slitting in an extension direction of the flexible circuit substrate to allow free and independent flexibility of each of the clustered flat cable components. This overcomes the problem of the conventional double-sided flexible printed circuit for use in an electronic product comprising both a touch panel and a hinge structure and eliminates the potential risk of damage or malfunction caused by abrasion between the body or bending zone of the conventional double-sided flexible printed circuit and the hinge structure so as to ensure no influence caused thereby on signal transmission and operation of the hinge structure.

Further, the present invention is also effective in overcoming the problems of the conventional double-sided flexible printed circuit board caused by the recent trend of electronic products being made light-weighted and compact and including an increasing number of electronic components, which leads to incapability of evasion of the electronic components by the conventional double-sided flexible printed circuit board, even with a bending zone provided thereto, and thus causing undesired compression and abrasion and eventually damaging the electronic components and/or the double-sided flexible printed circuit.

Further, in an embodiment of the double-sided flexible-circuit flat cable according to the present invention, a variable position jumper circuit may be adopted for realizing wiring jumping and thus improving flexibility of use.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
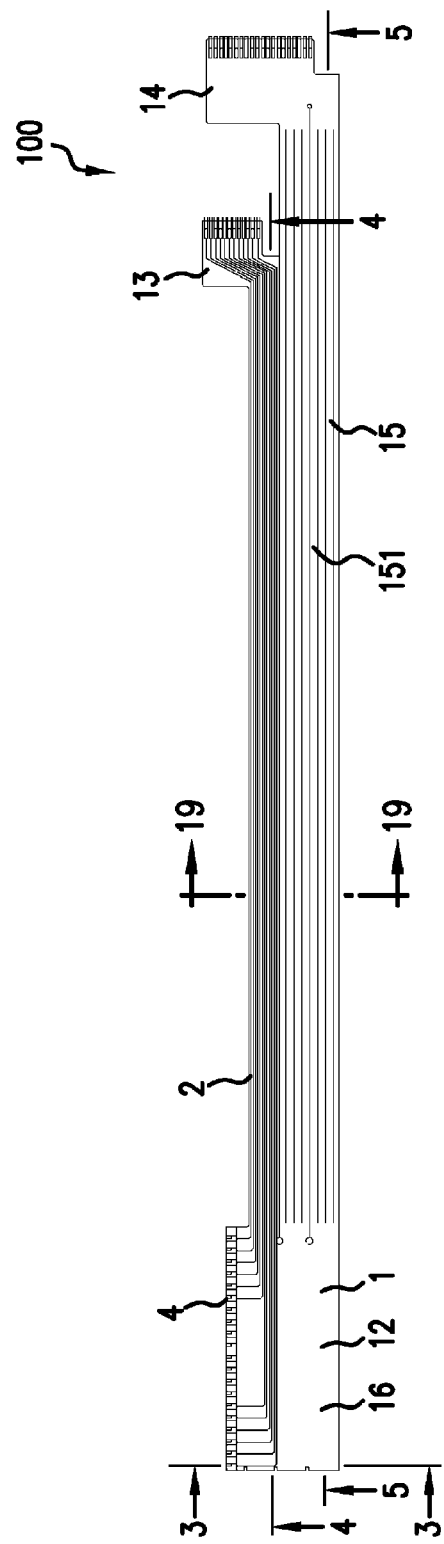
FIG. 1 is a top view of a double-side-conducting flexible-circuit flat cable constructed in accordance with a first embodiment of the present invention.
Figure 2:
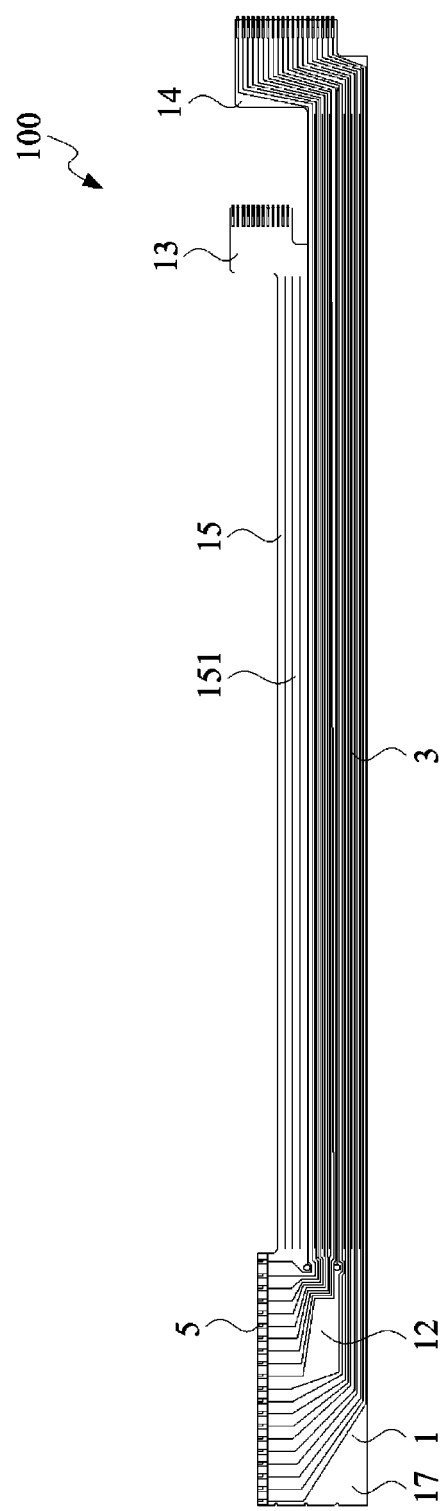
FIG. 2 is a bottom view of the flexible-circuit flat cable of the first embodiment of the present invention.

With reference to the drawings and in particular to FIGS. 1 and 2, FIG. 1 shows a top view of a double-side-conducting flexible-circuit flat cable constructed in accordance with a first embodiment of the present invention and FIG. 2 is a bottom view of the double-side-conducting flexible-circuit flat cable of the first embodiment of the present invention. The present invention provides a double-side-conducting flexible-circuit flat cable with cluster section, generally designated at 100, which comprises a flexible circuit substrate 1, a first electrical conduction path 2, a second electrical conduction path 3, a plurality of first conductive contact zones 4 and a plurality of second conductive contact zones 5. The flexible circuit substrate 1 has a first surface 10 and a second surface 11 and comprises, arranged in an extension direction, a first connection section 12, at least one second connection section 13, 14, and a cluster section 15 connected between the first connection section 12 and the second connection section 13, 14. The cluster section 15 is composed of a plurality of clustered flat cable components 151 that is formed by slitting the substrate in the extension direction so as to impose free and independent flexibility for bending to each of the clustered flat cable components 151.

Figure 3:
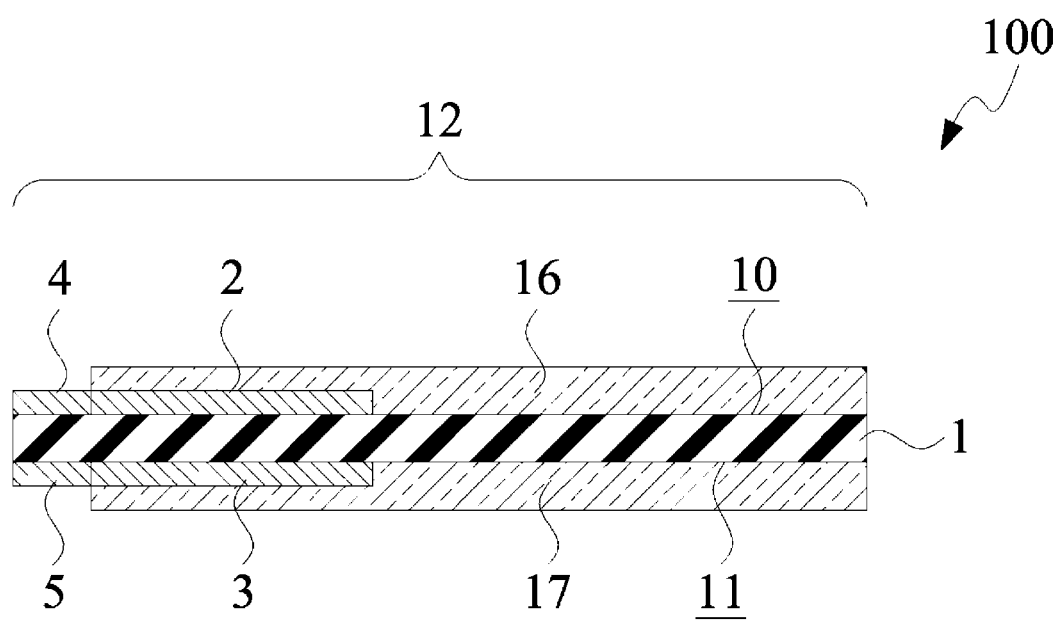
FIG. 3 is a cross-sectional view of the first embodiment of the present invention taken along line 3-3 of FIG. 1.
Figure 4:
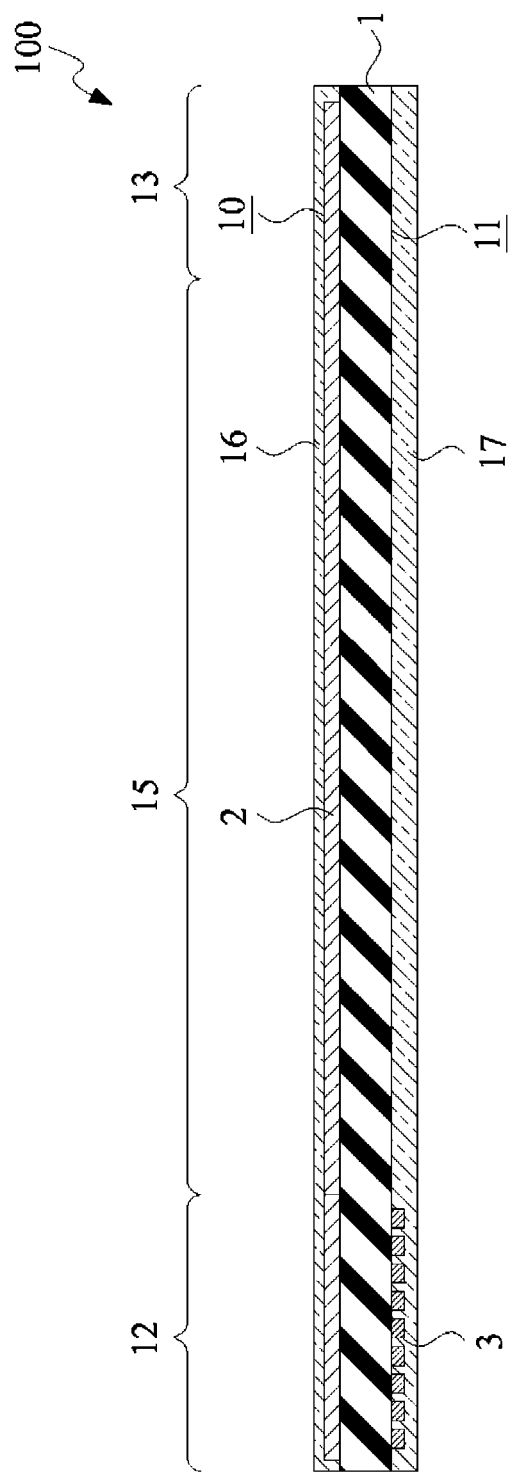
FIG. 4 is a cross-sectional view of the first embodiment of the present invention taken along line 4-4 of FIG. 1.
Figure 5:
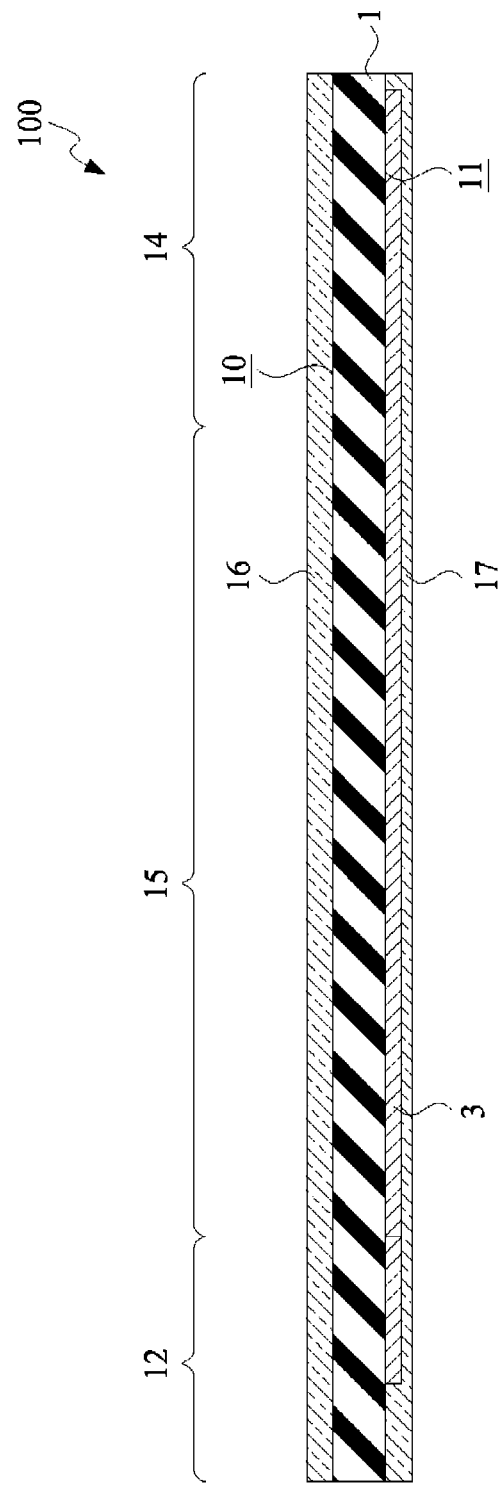
FIG. 5 is a cross-sectional view of the first embodiment of the present invention taken along line 5-5 of FIG. 1.

Also referring to FIGS. 3-5, FIG. 3 shows a cross-sectional view of the first embodiment of the present invention taken along line 3-3 of FIG. 1, FIG. 4 shows a cross-sectional view of the first embodiment of the present invention taken along line 4-4 of FIG. 1, and FIG. 5 shows a cross-sectional view of the first embodiment of the present invention taken along line 5-5 of FIG. 1. The first electrical conduction path 2 and the second electrical conduction path 3 are respectively formed on the first surface 10 and the second surface 11 of the flexible circuit substrate 1 and are made respectively extending along one of the clustered flat cable components 151 of the cluster section 15. In the instant embodiment, the first electrical conduction path 2 and the second electrical conduction path 3 comprise a plurality of metal traces that are formed by etching a metallic material. A covering layer 16 is laid on and covers the first surface 10 of the flexible circuit substrate 1 and the first electrical conduction path 2; while another a covering layer 17 is laid on and covers the second surface 11 of the flexible circuit substrate 1 and the second electrical conduction path 3.

A plurality of first conductive contact zones 4 is arranged on the first surface 10 of the flexible circuit substrate 1 at the first connection section 12 to be spaced from each other. Each of the first conductive contact zones 4 extends along one of the electrical conduction paths 151 of the cluster section 15 toward the second connection section 13. A plurality of second conductive contact zones 5 is arranged on the second surface 11 of the flexible circuit substrate 1 at the first connection section 12 to be spaced from each other. Each of the second conductive contact zones 5 extends along one of the electrical conduction paths 151 of the cluster section 15 toward the second connection section 14.

The plurality of first conductive contact zones 4 and the second conductive contact zones 5 of the first connection section 12 are provided for connection with predetermined circuits, while the second connection section 13, 14 can be provided with a connector or a plugging edge according to the requirement for different circuit signals for coupling with sockets of other circuits. The plugging edge, if adopted, may comprise a plugging structure of golden fingers that form a plurality of plugging terminals or a sculptured plugging structure. Further, besides being of a double-sided board structure, the double-side-conducting flexible-circuit flat cable according to the present invention may also be a combination of two single-sided boards stacked on each other for compliancy with practical needs of the industries.

Figure 6:
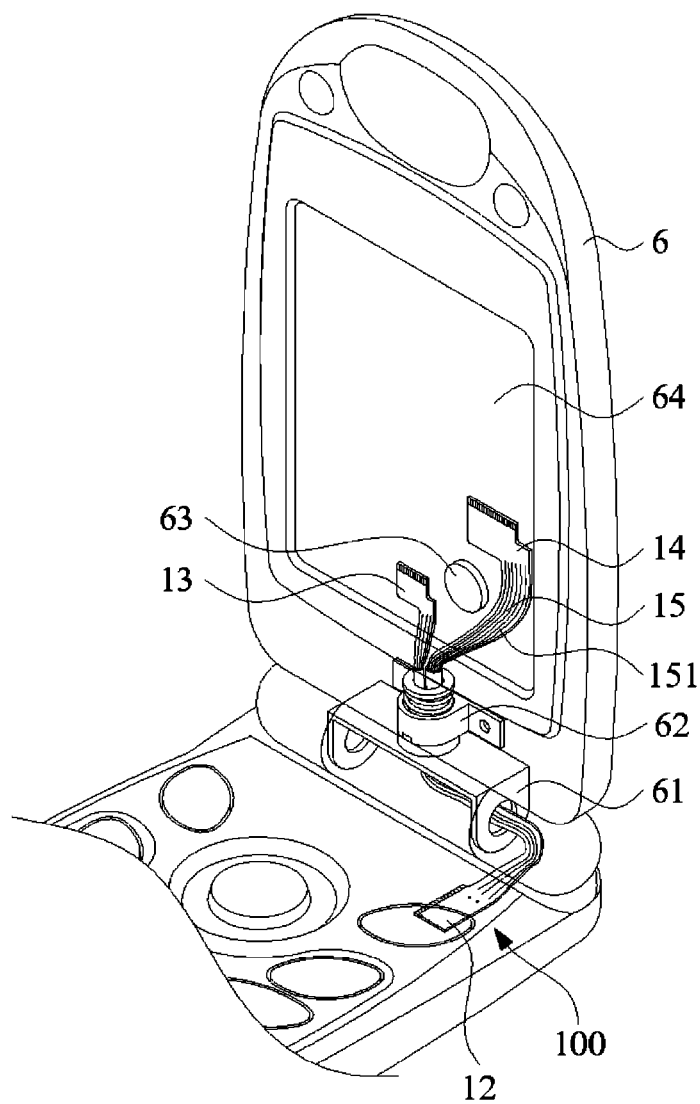
FIG. 6 shows an application of the present invention.

Referring to FIG. 6, an application of the present invention is shown. The double-side-conducting flexible-circuit flat cable 100 according to the present invention is applied to an electronic product 6 comprising a hinge structure 61. In the instant embodiment, the electronic product is a mobile phone. The second connection section 13, and the cluster section 15 of the double-side-conducting flexible-circuit flat cable 100 are inserted through a bore 62 of the hinge structure 61. As can be seen from the drawing, the second connection section 13, 14, when set inside the electronic product 6, is allowed to pass around an electronic component 63, whereby compression and/or abrasion caused by or applied to the electronic component 63 due to incapable of evasion can be avoided to thereby protect the electronic component 63 or the double-sided flexible printed circuit 100 from damage or malfunctioning.

Further, since each of the clustered flat cable components 151 of the cluster section 15 of the double-sided flexible-circuit flat cable 100 according to the present invention is allowed to freely and independently flex and bend, when a display screen 64 of the electronic product 6 is turned over frontward or rearward or is rotated in a horizontal plane, the double-sided flexible-circuit flat cable 100 according to the present invention is not affected by the frontward and rearward turning or horizontal rotation to cause a hinge component 61 to impose undesired abrasion on the clustered flat cable components 151, whereby the clustered flat cable components 151 can be well protected for stabilized transmission of signals.

Figure 7:
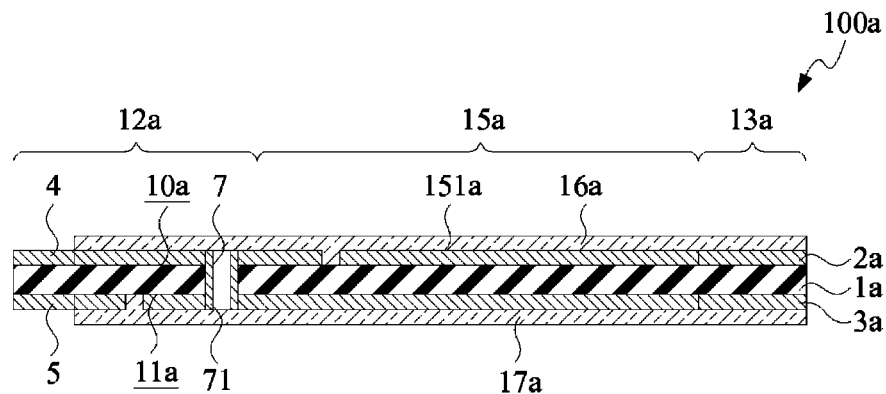
FIG. 7 is a cross-sectional view showing a flexible-circuit flat cable constructed according to a second embodiment of the present invention.
Figure 8:
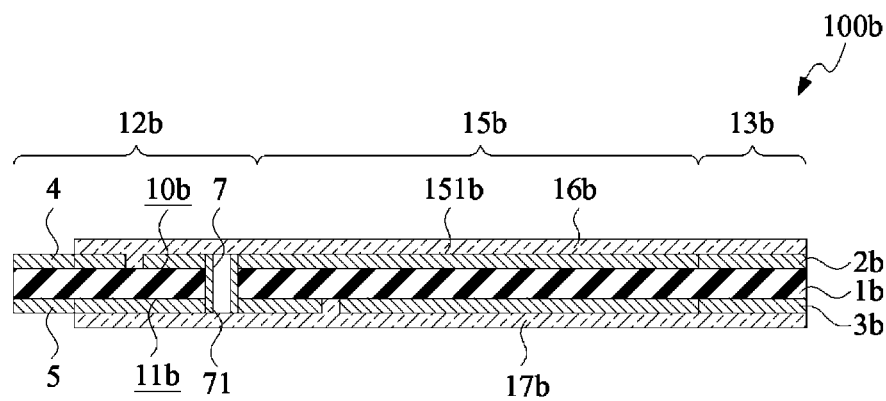
FIG. 8 is a cross-sectional view showing a flexible-circuit flat cable constructed according to a third embodiment of the present invention.

Referring to FIGS. 7 and 8, FIG. 7 is a cross-sectional view showing a flexible-circuit flat cable constructed according to a second embodiment of the present invention and FIG. 8 is a cross-sectional view showing a flexible-circuit flat cable constructed according to a third embodiment of the present invention. The two embodiments of the double-side-conducting flexible-circuit flat cable, respectively designated at 100a, 100b, have constructions similar to that of the first embodiment, and similar components/parts are designated with the same reference numerals for consistency and correspondence. A difference for the two embodiments is that a variable position jumper circuit is adopted. In other words, at least one through-hole structure 7 is formed through the first surface 10a, 10b and the second surface 11a, 11b of the first connection section 12a, 12b of the flexible circuit substrate 1a, 1b and the through-hole structure 7 has an inside surface on which an electrically conductive material 71 is formed to allow selected conductive lines of the first electrical conduction path 2a, 2b to electrically connect to corresponding conductive lines of the second electrical conduction path 3a, 3b.

In the second embodiment, the first conductive contact zones 4 extend along the selected conductive lines of the first electrical conduction path 2a, the through-hole structure 7, through the second electrical conduction path 3a of the clustered flat cable components 151a of the cluster section 15a to connect to the second connection section 13a, realizing wire jumping.

In the third embodiment, the second conductive contact zones 5 extend along selected conductive lines of the second electrical conduction path 3b, the through-hole structure 7, through and the first electrical conduction path 2b of the clustered flat cable components 151b of the cluster section 15b to connect to the second connection section 13b, realizing wire jumping.

The second connection section can be provided with a connector or a plugging edge (not shown) according to the requirement of circuit signal and is readily appreciated by those skilled in the art for connection with sockets of other circuits. No detail in this respect is needed herein.

Figure 9:
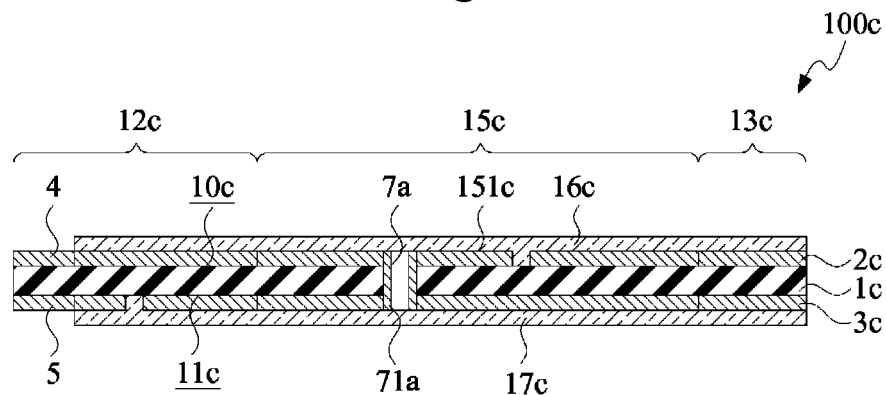
FIG. 9 is a cross-sectional view showing a flexible-circuit flat cable constructed according to a fourth embodiment of the present invention.
Figure 10:
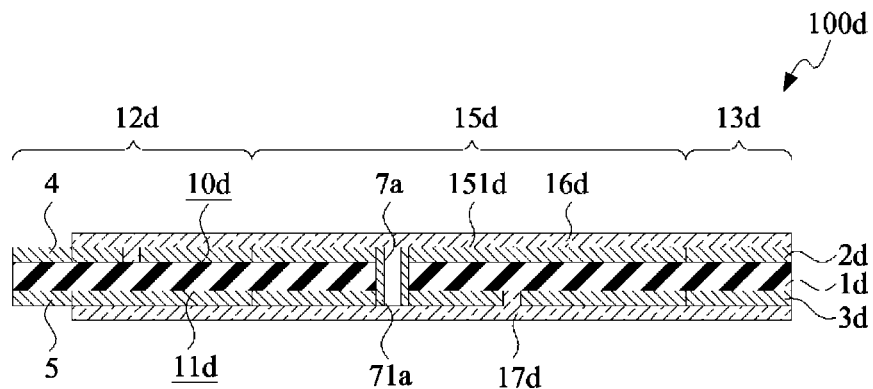
FIG. 10 is a cross-sectional view showing a flexible-circuit flat cable constructed according to a fifth embodiment of the present invention.

Referring to FIGS. 9 and 10, FIG. 9 is a cross-sectional view showing a flexible-circuit flat cable constructed according to a fourth embodiment of the present invention and FIG. 10 is a cross-sectional view showing a flexible-circuit flat cable constructed according to a fifth embodiment of the present invention. The two embodiments of the double-side-conducting flexible-circuit flat cable, respectively designated at 100c, 100d, have constructions similar to that of the first embodiment, and similar components/parts are designated with the same reference numerals for consistency and correspondence. A difference for the two embodiments is that a variable position jumper circuit is also adopted. In other words, at least one through-hole structure 7a is formed through the first surface 10c, 10d and the second surface 11c, 11d of one of clustered flat cable components 151c, 151d of the cluster section 15c, 15d of the flexible circuit substrate 1c, 1d and the through-hole structure 7a has an inside surface on which an electrically conductive material 71a is formed to allow selected conductive lines of the first electrical conduction path 2c, 2d to electrically connect to corresponding conductive lines of the second electrical conduction path 3c, 3d.

In the fourth embodiment, the first conductive contact zones 4 extend along the selected conductive lines of the first electrical conduction path 2c, the through-hole structure 7a, through the second electrical conduction path 3c of the clustered flat cable components 151c of the cluster section 15c to connect to the second connection section 13c, realizing wire jumping.

In the fifth embodiment, the second conductive contact zones 5 extend along selected conductive lines of the second electrical conduction path 3d, the through-hole structure 7a, through and the first electrical conduction path 2d of the clustered flat cable components 151d of the cluster section 15d to connect to the second connection section 13d, realizing wire jumping.

Figure 11:
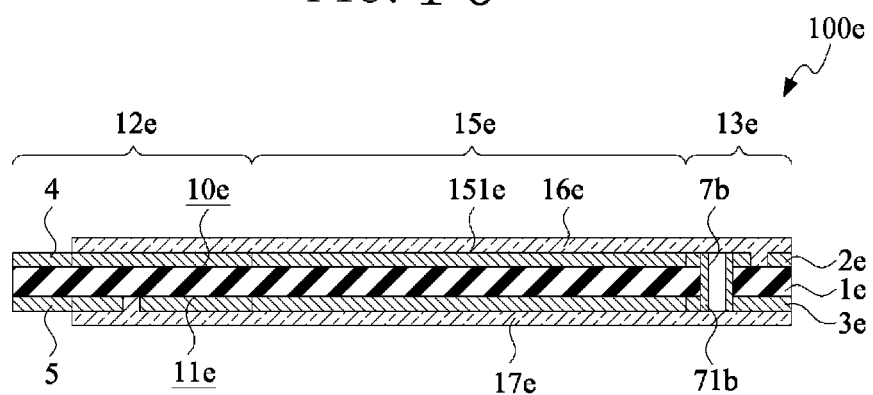
FIG. 11 is a cross-sectional view showing a flexible-circuit flat cable constructed according to a sixth embodiment of the present invention.
Figure 12:
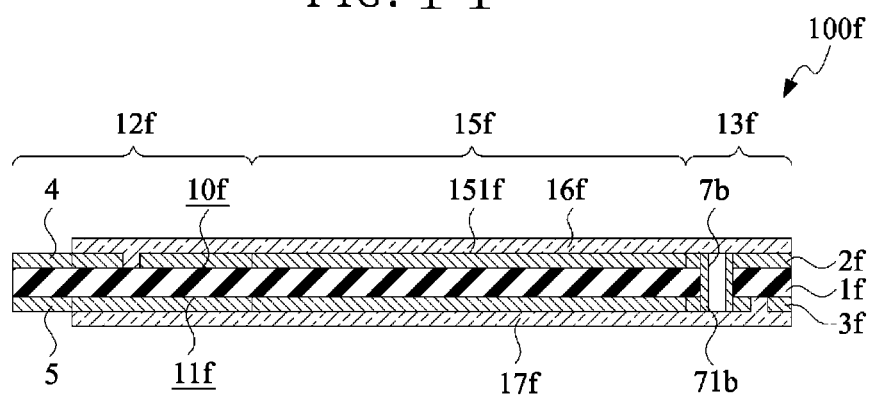
FIG. 12 is a cross-sectional view showing a flexible-circuit flat cable constructed according to a seventh embodiment of the present invention.

Referring to FIGS. 11 and 12, FIG. 11 is a cross-sectional view showing a flexible-circuit flat cable constructed according to a sixth embodiment of the present invention and FIG. 12 is a cross-sectional view showing a flexible-circuit flat cable constructed according to a seventh embodiment of the present invention. The two embodiments of the double-side-conducting flexible-circuit flat cable, respectively designated at 100e, 100f, have constructions similar to that of the first embodiment, and similar components/parts are designated with the same reference numerals for consistency and correspondence. A difference for the two embodiments is that a variable position jumper circuit is also adopted. In other words, at least one through-hole structure 7b is formed through the first surface 10e, 10f and the second surface 11e, 11f of the second connection section 13e, 13f of the flexible circuit substrate 1e, 1f and the through-hole structure 7b has an inside surface on which an electrically conductive material 71b is formed to allow selected conductive lines of the first electrical conduction path 2e, 2f to electrically connect to corresponding conductive lines of the second electrical conduction path 3e, 3f.

In the sixth embodiment, the first conductive contact zones 4 extend along the selected conductive lines of the first electrical conduction path 2e, the through-hole structure 7b formed in the second connection section 13e, and the second electrical conduction path 3e for signal connection and thus realizing wire jumping.

In the seventh embodiment, the second conductive contact zones 5 extend along selected conductive lines of the second electrical conduction path 3f, the through-hole structure 7b formed in the second connection section 13f, and the first electrical conduction path 2f for signal connection and thus realizing wire jumping.

Figure 13:
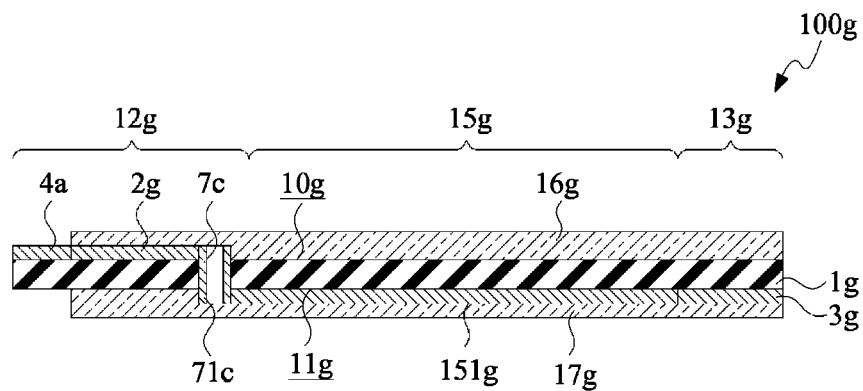
FIG. 13 is a cross-sectional view showing a flexible-circuit flat cable constructed according to an eighth embodiment of the present invention.

Referring to FIG. 13, FIG. 13 is a cross-sectional view showing a flexible-circuit flat cable constructed according to an eighth embodiment of the present invention. This embodiment of the double-side-conducting flexible-circuit flat cable, designated at 100g, has a construction similar to that of the first embodiment, and similar components/parts are designated with the same reference numerals for consistency and correspondence. A difference for this embodiment is that a plurality of first conductive contact zones 4a and a plurality of second conductive contact zones 5a are arranged on the first surface 10g of the flexible circuit substrate 1g at the first connection section 12g, wherein a through-hole structure 7c is formed through the first surface 10g and the second surface 11g of the first connection section 12g of the flexible circuit substrate 1g and the through-hole structure 7c has an inside surface on which an electrically conductive material 71c is formed to allow selected conductive lines of the first electrical conduction path 2g to electrically connect to corresponding conductive lines of the second electrical conduction path 3g.

The first conductive contact zones 4a and the second conductive contact zones 5a (not shown) extend along the selected conductive lines of the first electrical conduction path 2g, the through-hole structure 7c, through the second electrical conduction path 3g of the clustered flat cable components 151g of the cluster section 15g to connect to the second connection section 13g, realizing a variable position jumper circuit.

Figure 14:
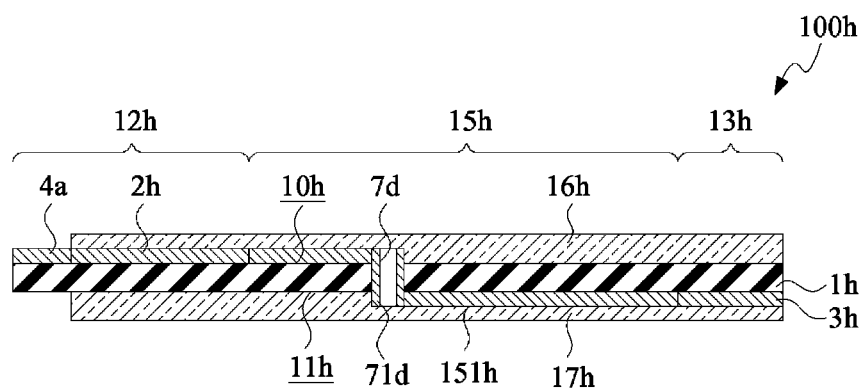
FIG. 14 is a cross-sectional view showing a flexible-circuit flat cable constructed according to a ninth embodiment of the present invention.

Referring to FIG. 14, FIG. 14 is a cross-sectional view showing a flexible-circuit flat cable constructed according to a ninth embodiment of the present invention. This embodiment of the double-side-conducting flexible-circuit flat cable, designated at 100h, has a construction similar to that of the eighth embodiment, and similar components/parts are designated with the same reference numerals for consistency and correspondence. A difference for this embodiment is that a through-hole structure 7d is formed through the first surface 10h and the second surface 11h of one of the clustered flat cable components 151h of the cluster section 15h of the flexible circuit substrate 1h and the through-hole structure 7d has an inside surface on which an electrically conductive material 71d is formed to allow selected conductive lines of the first electrical conduction path 2h to electrically connect to corresponding conductive lines of the second electrical conduction path 3h.

The first conductive contact zones 4a and the second conductive contact zones 5a (not shown) extend along the selected conductive lines of the first electrical conduction path 2h, the through-hole structure 7d, through the second electrical conduction path 3h of the clustered flat cable components 151g of the cluster section 15g to connect to the second connection section 13h, realizing a variable position jumper circuit.

Figure 15:
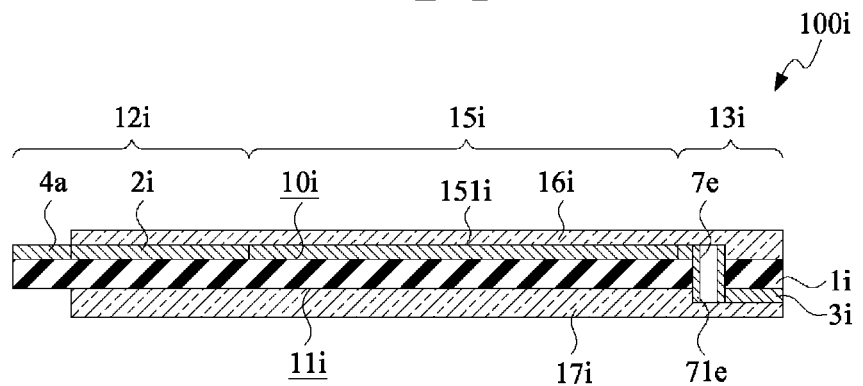
FIG. 15 is a cross-sectional view showing a flexible-circuit flat cable constructed according to a tenth embodiment of the present invention.

Referring to FIG. 15, FIG. 15 is a cross-sectional view showing a flexible-circuit flat cable constructed according to a tenth embodiment of the present invention. This embodiment of the double-side-conducting flexible-circuit flat cable, designated at 100i, has a construction similar to that of the first embodiment, and similar components/parts are designated with the same reference numerals for consistency and correspondence. A difference for this embodiment is that a through-hole structure 7e is formed through the first surface 10i and the second surface 11i of the second connection section 13i of the flexible circuit substrate 1i and the through-hole structure 7e has an inside surface on which an electrically conductive material 71e is formed to allow selected conductive lines of the first electrical conduction path 2i to electrically connect to corresponding conductive lines of the second electrical conduction path 3i.

The first conductive contact zones 4a extend along the selected conductive lines of the first electrical conduction path 2i, the through-hole structure 7c defined in the second connection section 13i, and the second electrical conduction path 3i for signal connection and thus realizing a variable position jumper circuit.

Figure 16:
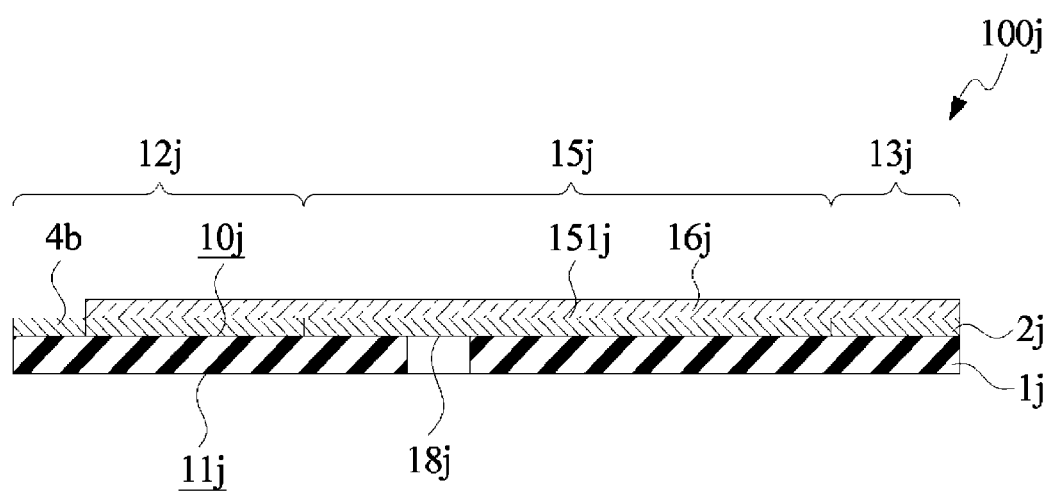
FIG. 16 is a cross-sectional view showing a flexible-circuit flat cable constructed according to an eleventh embodiment of the present invention.

Referring to FIG. 16, FIG. 16 is a cross-sectional view showing a flexible-circuit flat cable constructed according to an eleventh embodiment of the present invention. This embodiment of the double-side-conducting flexible-circuit flat cable, designated at 100j, comprises a first electrical conduction path 2j formed a first surface 10j of a flexible circuit substrate 1j and extending along one of clustered flat cable components 151j of a cluster section 15j and a plurality of conductive contact zones 4b is arranged on the first surface 10j of the first connection section 12j of the flexible circuit substrate 1j in such a way that each of the conductive contact zones 4b extends through one of conductive lines of an electrical conduction path 2j of the cluster section 15j toward a second connection section 13j.

An exposed contact zone 18j is formed through the first surface 10j and the second surface 11j of the flexible circuit substrate 1j to provide an arrangement shown in the drawing, so that a predetermined line is allowed to electrically connect to the electrical conduction path 2j of the present invention through the exposed contact zone 18j so that an effect of single copper foil with double side connection that is readily appreciated in this field of art can be realized.

Figure 17:
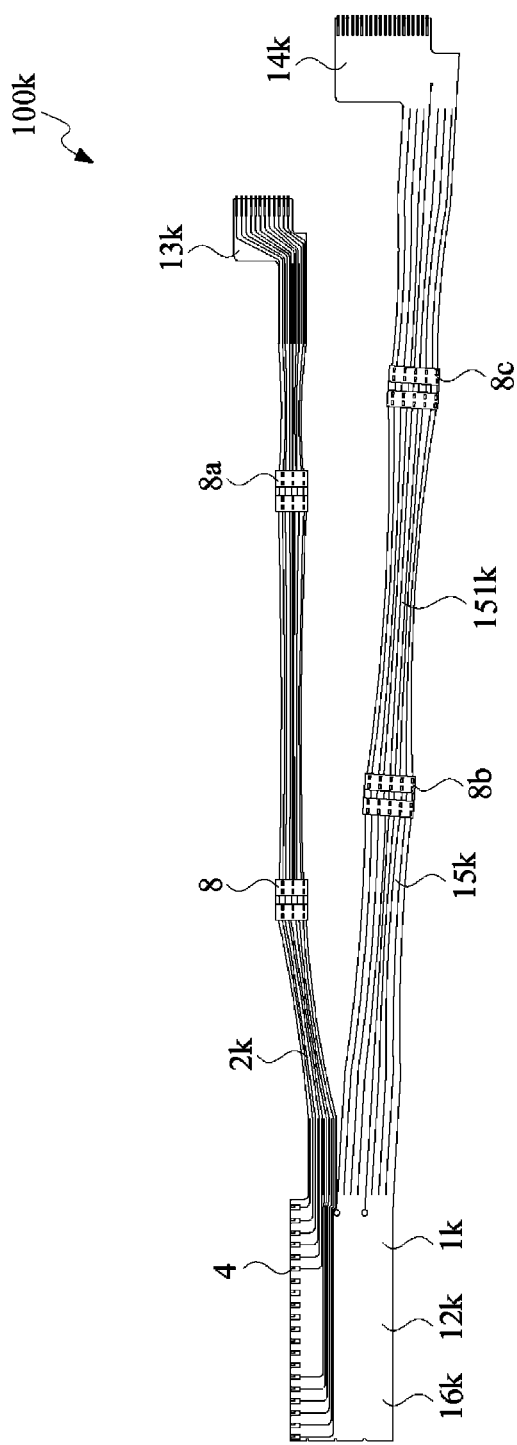
FIG. 17 is a cross-sectional view showing a flexible-circuit flat cable constructed according to a twelfth embodiment of the present invention.

Referring to FIG. 17, FIG. 17 is a cross-sectional view showing a flexible-circuit flat cable constructed according to a twelfth embodiment of the present invention. This embodiment of the double-side-conducting flexible-circuit flat cable, designated at 100k, comprises a bundling structure 8, 8a, 8b, 8c arranged on one side of a predetermined one of the clustered flat cable components 151k of the cluster section 15k. The bundling structure 8, 8a, 8b, 8c comprises a fastening section so that when each of the clustered flat cable components 151k of the cluster section 15k is stacked to form a bundle like structure, the bundling structure 8, 8a, 8b, 8c wraps around the plurality of clustered flat cable components 151k and is secured through the fastening section to show the arrangement illustrated in the drawing. This improves flexibility of use of the present invention in electronic product and circuits.

Figure 18:
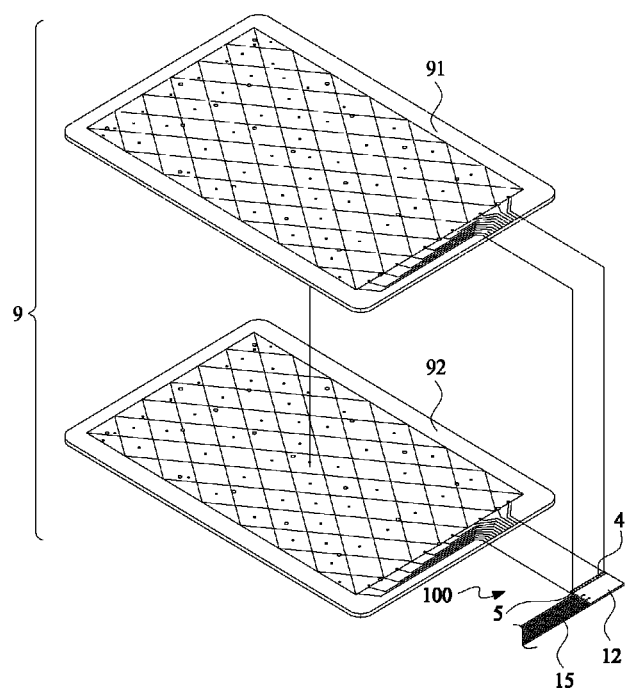
FIG. 18 shows another application of the present invention.
Figure 19:
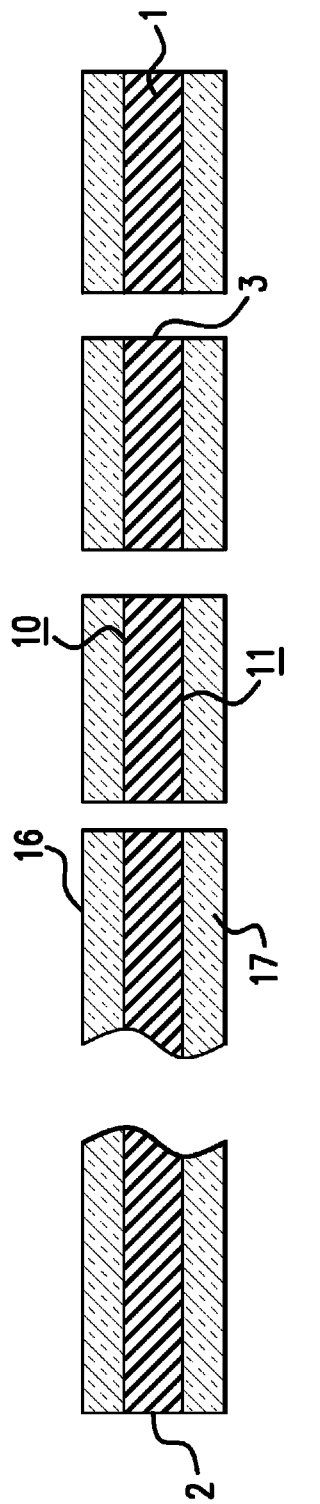
FIG. 19 is a cross-sectional view of the first embodiment of the present invention taken along line 19-19 of FIG. 1.

Referring to FIG. 18, FIG. 18 shows another application of the present invention. The present invention is applied to a touch panel 9, which comprises a substrate 91 and a touch control circuit pattern 92. The substrate 91 can be a glass substrate. The double-side-conducting flexible-circuit flat cable 100 according to the present invention, after being subjected to a thermal bonding process, is attached to the substrate 91 and the touch control circuit pattern 92. Since the first conductive contact zones 4 and the second conductive contact zones 5 of the present invention are respectively arranged on the first surface 10 and the second surface 11 of the first connection section 12, it is possible to have the first conductive contact zones 4 and the second conductive contact zones 5 respectively and electrically connected to the substrate 91 and the touch control circuit pattern 92 of the touch panel 9 so as to realize double side conducting.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A double-side-conducting flexible-circuit flat cable, comprising:
   a flexible circuit substrate, which has a first surface and a second surface, the flexible circuit substrate comprising, in an extension direction, a first double sided golden fingers connection section, a plurality of single sided second golden fingers connection sections, and a cluster section connected between the first connection section and the second connection sections, the cluster section being composed of a plurality of clustered flat cable components formed by slitting in the extension direction;
   a first electrical conduction path, which is formed on a first portion of the first surface of the flexible circuit substrate and extending along one of the clustered flat cable components of the cluster section;
   a second electrical conduction path, which is formed on a second portion of the second surface of the flexible circuit substrate and extending along one of the clustered flat cable components of the cluster section;
   a plurality of first conductive contact zones, which is arranged on the first surface of the flexible circuit substrate at the first double sided golden fingers connection section to be spaced from each other, each of the first conductive contact zones extending along one of the electrical conduction paths of the cluster section toward the plurality of single sided golden fingers second connection section; and,
   a plurality of second conductive contact zones, which is arranged on the second surface of the flexible circuit substrate at the first double sided golden fingers connection section to be spaced from each other, each of the second conductive contact zones extending along one of the electrical conduction paths of the cluster section toward the plurality of single sided golden fingers second connection section.

2. The double-side-conducting flexible-circuit flat cable as claimed in claim 1, wherein at least one through-hole structure is formed through the first surface and the second surface of the first connection section of the flexible circuit substrate, the through-hole structure having an inside surface on which an electrically conductive material is formed to allow selected conductive lines of the first electrical conduction path to electrically connect to the second electrical conduction path.

3. The double-side-conducting flexible-circuit flat cable as claimed in claim 2, wherein the first conductive contact zones extend along selected conductive lines of the first electrical conduction path, the through-hole structure, through the second electrical conduction path of the clustered flat cable components of the cluster section to connect to the second connection section.

4. The double-side-conducting flexible-circuit flat cable as claimed in claim 2, wherein the second conductive contact zones extend along selected conductive lines of the second electrical conduction path, the through-hole structure, through the first electrical conduction path of the clustered flat cable components of the cluster section to connect to the second connection section.

5. The double-side-conducting flexible-circuit flat cable as claimed in claim 1, wherein at least one through-hole structure is formed through the first surface and the second surface of one of the clustered flat cable components of the cluster section of the flexible circuit substrate, the through-hole structure having an inside surface on which an electrically conductive material is formed to allow selected conductive lines of the first electrical conduction path to electrically connect to the second electrical conduction path.

6. The double-side-conducting flexible-circuit flat cable as claimed in claim 5, wherein the first conductive contact zones extend along selected conductive lines of the first electrical conduction path, the through-hole structure, and selected conducive lines of the second electrical conduction path to connect to the second connection section.

7. The double-side-conducting flexible-circuit flat cable as claimed in claim 5, wherein the second conductive contact zones extend along selected conductive lines of the second electrical conduction path, the through-hole structure, and selected conducive lines of the first electrical conduction path to connect to the first connection section.

8. The double-side-conducting flexible-circuit flat cable as claimed in claim 1, wherein at least one through-hole structure is formed through the first surface and the second surface of the second connection section of the flexible circuit substrate, the through-hole structure having an inside surface on which an electrically conductive material is formed to allow selected conductive lines of the first electrical conduction path to electrically connect to the second electrical conduction path.

9. The double-side-conducting flexible-circuit flat cable as claimed in claim 1 further comprising at least one bundling structure arranged on one side of a predetermined one of the clustered flat cable components of the cluster section, the bundling structure comprising a fastening section, whereby when each of the clustered flat cable components of the cluster section is stacked to form a bundle like structure, the bundling structure is allowed to wrap around the clustered flat cable components and is secured through the fastening section.

* * * * *